(12) United States Patent
Koyanagi

(10) Patent No.: US 9,531,154 B2
(45) Date of Patent: *Dec. 27, 2016

(54) LIFT-OFF METHOD

(71) Applicant: DISCO CORPORATION, Tokyo (JP)

(72) Inventor: Tasuku Koyanagi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/798,011

(22) Filed: Jul. 13, 2015

(65) Prior Publication Data
US 2016/0013613 A1 Jan. 14, 2016

(30) Foreign Application Priority Data
Jul. 14, 2014 (JP) .................................. 2014-144064

(51) Int. Cl.
*B32B 38/10* (2006.01)
*H01S 5/02* (2006.01)
(Continued)

(52) U.S. Cl.
CPC ......... *H01S 5/0217* (2013.01); *H01L 33/0079* (2013.01); *B32B 38/10* (2013.01);
(Continued)

(58) Field of Classification Search
CPC .. B32B 38/10; B32B 43/006; Y10T 156/1121; Y10T 156/1158; Y10T 156/1917; Y10T 156/1922; H01L 21/2026; H01L 21/7813
(Continued)

(56) References Cited

U.S. PATENT DOCUMENTS

2003/0087476 A1 5/2003 Oohata et al.
2007/0275544 A1* 11/2007 Maki ................. H01L 21/67092
438/464
(Continued)

FOREIGN PATENT DOCUMENTS

JP 10-305420 11/1998
JP 2004-72052 3/2004
(Continued)

OTHER PUBLICATIONS

U.S. Appl. No. 14/606,488, filed Jan. 27, 2015.
U.S. Appl. No. 14/612,732, filed Feb. 3, 2015.
U.S. Appl. No. 14/716,149, filed May 19, 2015.

*Primary Examiner* — Mark A Osele
*Assistant Examiner* — Nickolas Harm
(74) *Attorney, Agent, or Firm* — Greer Burns & Crain, Ltd.

(57) ABSTRACT

In an optical device wafer, an optical device layer is formed over a front surface of an epitaxy substrate with the intermediary of a buffer layer composed of a Ga compound containing Ga. After a transfer substrate is joined to the optical device layer of the optical device wafer, a separation layer is formed at a boundary surface between the epitaxy substrate and the buffer layer by performing irradiation with a pulsed laser beam having such a wavelength as to be transmitted through the epitaxy substrate and be absorbed by the buffer layer from a back surface side of the epitaxy substrate. Thereafter, an ultrasonic horn that oscillates ultrasonic vibration is brought into contact with an outer circumferential part of the epitaxy substrate to vibrate the epitaxy substrate, and the epitaxy substrate is separated from the transfer substrate to transfer the optical device layer to the transfer substrate.

2 Claims, 10 Drawing Sheets

(51) Int. Cl.
  *H01L 33/00*  (2010.01)
  *H01L 21/78*  (2006.01)
  *H01L 21/20*  (2006.01)
  *B32B 43/00*  (2006.01)

(52) U.S. Cl.
  CPC ......... *B32B 43/006* (2013.01); *H01L 21/2026* (2013.01); *H01L 21/7813* (2013.01); *Y10T 156/1121* (2015.01); *Y10T 156/1158* (2015.01); *Y10T 156/1917* (2015.01); *Y10T 156/1922* (2015.01)

(58) Field of Classification Search
  USPC ................ 156/705, 712, 753, 754, 930, 941
  See application file for complete search history.

(56) References Cited

U.S. PATENT DOCUMENTS

| | | |
|---|---|---|
| 2009/0053845 A1 | 2/2009 | Wong et al. |
| 2009/0253273 A1 | 10/2009 | Sano et al. |
| 2012/0095584 A1 | 4/2012 | Ando et al. |
| 2012/0168911 A1 | 7/2012 | Chen et al. |
| 2013/0017640 A1* | 1/2013 | Morikazu .............. B23K 26/00 438/46 |
| 2013/0065010 A1 | 3/2013 | Hayashi et al. |

FOREIGN PATENT DOCUMENTS

| | | |
|---|---|---|
| JP | 2011-103361 | 5/2011 |
| JP | 2011093803 | 5/2011 |

\* cited by examiner

LIFT-OFF METHOD

BACKGROUND OF THE INVENTION

Field of the Invention

The present invention relates to a lift-off method of transferring an optical device layer stacked over a surface of an epitaxy substrate with the intermediary of a buffer layer to a transfer substrate.

Description of the Related Art

In an optical device manufacturing process, an optical device layer formed of an n-type semiconductor layer and a p-type semiconductor layer composed of GaN (gallium nitride) or the like is formed over a surface of an epitaxy substrate such as a sapphire substrate or a silicon carbide substrate having a substantially circular disc shape with the intermediary of a buffer layer. Furthermore, optical devices such as light emitting diodes or laser diodes are formed in plural regions marked out by plural streets formed in a lattice manner to form an optical device wafer. Then, the individual optical devices are manufactured by dividing the optical device wafer along the streets (refer to Japanese Patent Laid-Open No. Hei 10-305420 for example).

Furthermore, as a technique to improve the luminance of optical devices, a manufacturing method called lift-off is disclosed in Japanese Patent Laid-Open No. 2004-72052. In this method, an optical device layer formed of an n-type semiconductor layer and a p-type semiconductor layer formed over a front surface of an epitaxy substrate such as a sapphire substrate or a silicon carbide substrate forming an optical device wafer with the intermediary of a buffer layer is joined to a transfer substrate of molybdenum (Mo), copper (Cu), or silicon (Si) with the intermediary of a joining material such as AuSn (gold tin). Then, the buffer layer is broken by irradiating the buffer layer with a laser beam having such a wavelength as to be transmitted through the epitaxy substrate and be absorbed by the buffer layer from the back surface side of the epitaxy substrate. Then, the epitaxy substrate is separated from the optical device layer and thereby the optical device layer is transferred to the transfer substrate.

SUMMARY OF THE INVENTION

In the method in which the buffer layer is irradiated with the laser beam as described above, the buffer layer cannot be sufficiently broken in some cases and thus there is a problem that the epitaxy substrate cannot be smoothly separated from the optical device layer. For example, Japanese Patent Laid-Open No. 2011-103361 discloses a technique in which ultrasonic waves are radiated to a silicon substrate via purified water in which the silicon substrate is immersed and a metal film on the silicon substrate is separated and removed, but includes no disclosure about the point of transferring the optical device layer as described above.

Therefore, an object of the present invention is to provide a lift-off method by which an epitaxy substrate can be smoothly separated even when a buffer layer cannot be sufficiently broken.

In accordance with an aspect of the present invention, there is provided a lift-off method for transferring, to a transfer substrate, an optical device layer of an optical device wafer in which the optical device layer is formed over a front surface of an epitaxy substrate with intermediary of a buffer layer composed of a Ga compound containing Ga. The lift-off method includes a transfer substrate joining step of joining the transfer substrate to a surface of the optical device layer of the optical device wafer with intermediary of a joining metal layer, a separation layer forming step of forming a separation layer at a boundary surface between the epitaxy substrate and the buffer layer by performing irradiation with a pulsed laser beam having such a wavelength as to be transmitted through the epitaxy substrate and be absorbed by the buffer layer from a back surface side of the epitaxy substrate of the optical device wafer to which the transfer substrate is joined, and an optical device layer transfer step of, after the separation layer forming step is carried out, bringing an ultrasonic horn that oscillates ultrasonic vibration into contact with the epitaxy substrate to vibrate the epitaxy substrate and separating the epitaxy substrate from the transfer substrate to transfer the optical device layer to the transfer substrate.

According to the above lift-off method, the ultrasonic horn is brought into contact with the epitaxy substrate to propagate the ultrasonic vibration. Thus, the vibration can be efficiently propagated from the ultrasonic horn to the epitaxy substrate and the coupling between the epitaxy substrate and the optical device layer by the buffer layer can be sufficiently broken. This can avoid the occurrence of damage to the optical device layer due to the separation of the epitaxy substrate and separate the epitaxy substrate from the optical device layer rapidly and smoothly.

Preferably, in the lift-off method of the present invention, the ultrasonic horn is brought into contact with an outer circumferential part of the epitaxy substrate in the optical device layer transfer step. According to this method, the vibration can be propagated from the ultrasonic horn to the epitaxy substrate more efficiently.

The ultrasonic horn according to the present invention is used for the above lift-off method and is characterized in that the contact surface that is at the tip of the ultrasonic horn and gets contact with the epitaxy substrate is formed of a slightly-curved surface. According to this configuration, because the tip of the ultrasonic horn is formed into the curved surface, the efficiency of the vibration propagation from the ultrasonic horn to the epitaxy substrate can be enhanced even when warpage is caused in the epitaxy substrate.

According to the present invention, the ultrasonic horn is brought into contact with the outer circumferential part of the epitaxy substrate to propagate the ultrasonic vibration. Thus, the buffer layer can be sufficiently broken and the epitaxy substrate can be smoothly separated.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
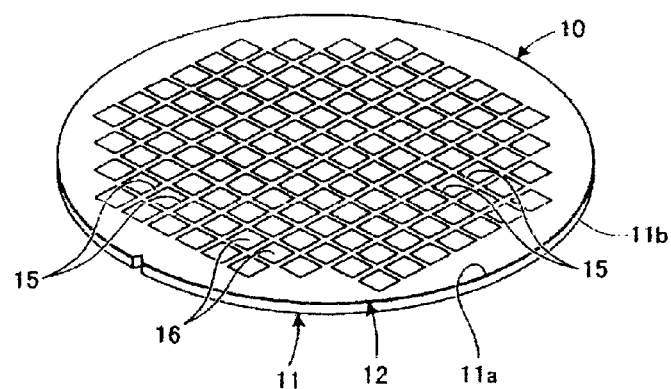
FIG. 1A is a perspective view of an optical device wafer.
Figure 1B:
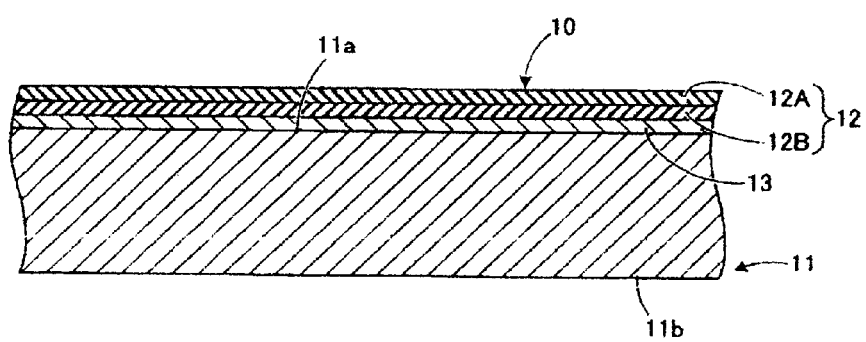
FIG. 1B is an enlarged sectional view of the optical device wafer.

An optical device wafer 10 shown in FIGS. 1A and 1B is a wafer for manufacturing optical devices. The optical device wafer 10 has an epitaxy substrate 11 formed of a sapphire substrate having a circular disc shape with a diameter of 50 mm and a thickness of 60 μm and an optical device layer 12 stacked (formed) on the side of a front surface 11a of the epitaxy substrate 11. The optical device layer 12 is composed of an n-type gallium nitride semiconductor layer 12A and a p-type gallium nitride semiconductor layer 12B (not shown in FIG. 1A) formed over the front surface 11a of the epitaxy substrate 11 by an epitaxial growth method. In stacking the optical device layer 12 over the epitaxy substrate 11, a buffer layer 13 (not shown in FIG. 1A) that is composed of GaN and has a thickness of e.g. 1 μm is formed between the front surface 11a of the epitaxy substrate 11 and the n-type gallium nitride semiconductor layer 12B. In the present embodiment, the thickness of the optical device layer 12 is set to e.g. 10 μm. In the optical device layer 12, optical devices 16 are formed in plural regions marked out by plural planned dividing lines 15 formed in a lattice manner (not shown in FIG. 1B).

Figure 2A:
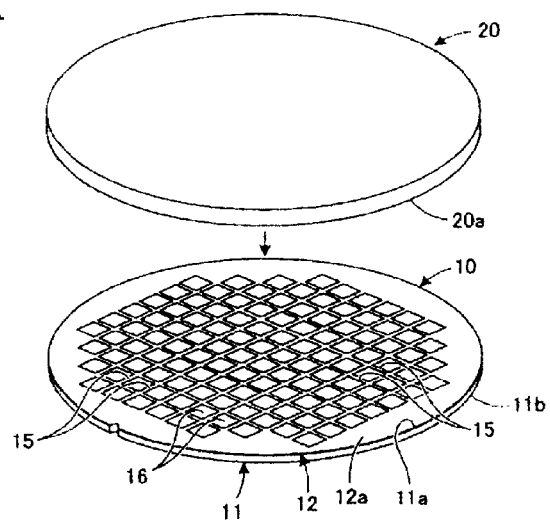
FIGS. 2A and 2B are perspective views showing a transfer substrate joining step.
Figure 2B:
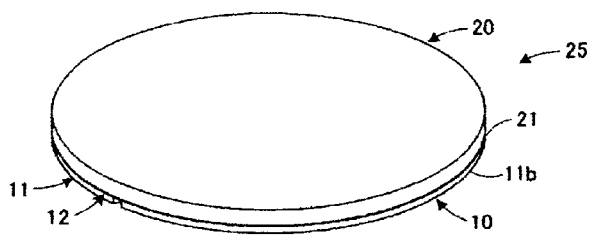
Figure 2C:
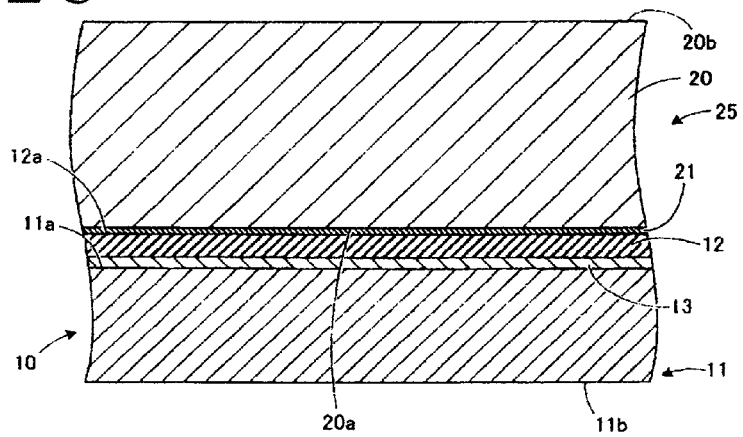
FIG. 2C is an enlarged sectional view of a state in which a transfer substrate is joined onto the optical device wafer.

Subsequently, a lift-off method according to the present embodiment will be described with reference to FIGS. 2A to 10B. First, as shown in FIGS. 2A to 2C, a transfer substrate joining step of joining a transfer substrate 20 to the side of the optical device layer 12 of the optical device wafer 10 is carried out. FIG. 2A is a schematic perspective view of the optical device wafer 10 and the transfer substrate 20 before the joining. FIG. 2B is a schematic perspective view of the optical device wafer 10 and the transfer substrate 20 after the joining. FIG. 2C is an enlarged sectional view of the major part of the optical device wafer 10 and the transfer substrate 20 joined to each other.

In the transfer substrate joining step, the transfer substrate 20 formed of a copper substrate having a thickness of 1 mm is joined to a surface 12a of the optical device layer 12 with the intermediary of a joining metal layer 21. As the transfer substrate 20, molybdenum (Mo), silicon (Si), or the like can be used. As the joining metal to form the joining metal layer 21, gold (Au), platinum (Pt), chromium (Cr), indium (In), palladium (Pd), or the like can be used. In this transfer substrate joining step, the above joining metal is evaporated onto the surface 12a of the optical device layer 12 or a surface 20a of the transfer substrate 20 to form the joining metal layer 21 having a thickness of about 3 μm. Then, the joining metal layer 21 is made to face the surface 20a of the transfer substrate 20 or the surface 12a of the optical device layer 12 and pressure bonding therebetween is performed. Thereby, a composite substrate 25 in which the optical device wafer 10 and the transfer substrate 20 are joined to each other with the intermediary of the joining metal layer 21 is formed.

Figure 3:
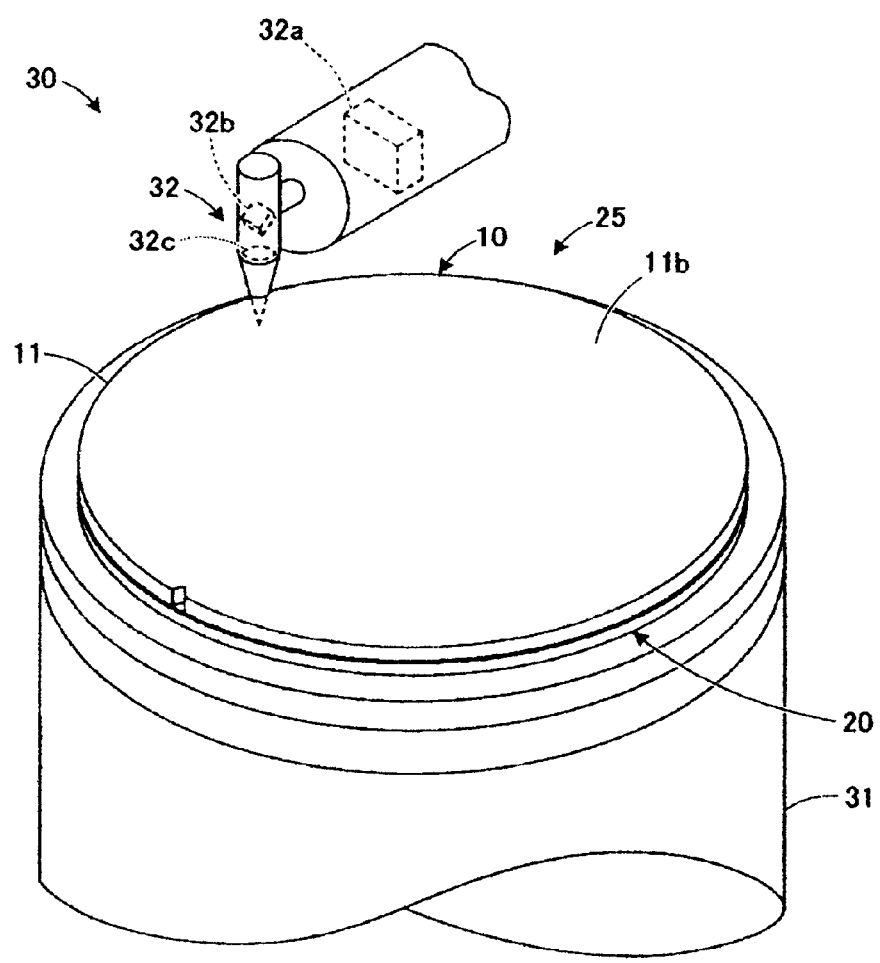
FIG. 3 is a schematic perspective view showing a separation layer forming step.
Figure 4:
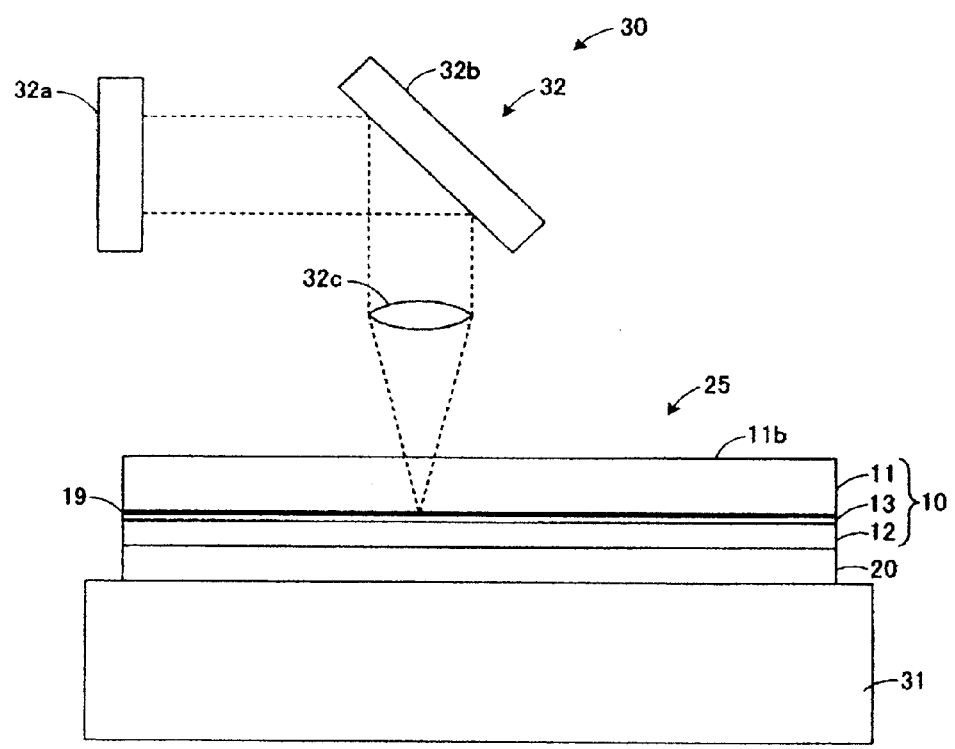
FIG. 4 is a schematic diagram showing the separation layer forming step.
Figure 5:
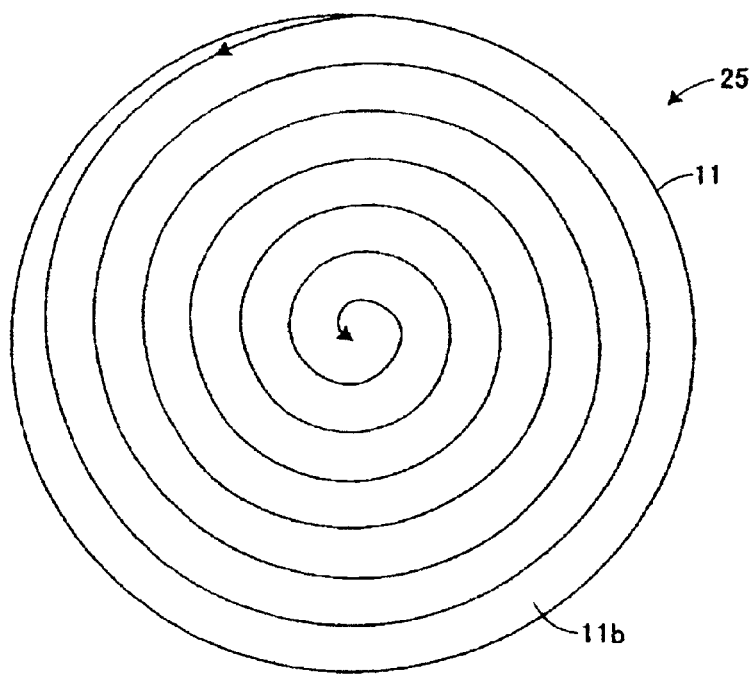
FIG. 5 is a plan view showing the trajectory of the irradiation position of a laser beam in the separation layer forming step.

After the transfer substrate joining step is carried out, a separation layer forming step is carried out as shown in FIGS. 3 to 5. FIG. 3 is a schematic perspective view for explaining the separation layer forming step. FIG. 4 is a schematic diagram for explaining the separation layer forming step. FIG. 5 is an explanatory plan view showing the trajectory of the irradiation position of a laser beam.

In the separation layer forming step, the side of the transfer substrate 20 of the composite substrate 25 is placed on the top surface (holding surface) of a chuck table 31 in laser processing apparatus 30. Then, on the chuck table 31, the composite substrate 25 is held by suction by a suction unit (not shown), with a back surface 11b of the epitaxy substrate 11 oriented upward. After this holding by suction, a moving unit (not shown) is actuated to move a laser beam irradiating unit 32 and set the laser beam irradiation position of the laser beam irradiating unit 32 at the outermost circumference of the epitaxy substrate 11. Thereafter, by the laser beam irradiating unit 32, irradiation with a pulsed laser beam is performed from the side of the back surface 11b of the epitaxy substrate 11 (upper side in the diagram). In the laser beam irradiating unit 32, a laser beam set to such a wavelength as to be transmitted through the epitaxy substrate 11 and be absorbed by the buffer layer 13 is oscillated from a laser beam oscillator 32a. Then, the laser beam oscillated from the laser beam oscillator 32a is reflected by a mirror 32b to be incident on a condensing lens 32c. The condensing lens 32c sets the light focus point at the buffer layer 13 to irradiate the buffer layer 13 with the laser beam.

The mirror 32b is formed of a galvano mirror or the like and the reflection angle thereof is allowed to be adjusted. The mirror 32b is so set as to enable scanning with the laser beam condensed by the condensing lens 32c in an arbitrary direction along the surface direction of the buffer layer 13. In the present embodiment, the scanning is so performed that, in the plan view shown in FIG. 5, the light focus point of the laser beam makes a spiral trajectory from the outermost circumference of the epitaxy substrate 11 toward the center. Thereby, the region corresponding to the whole surface of the buffer layer 13 is irradiated with the laser beam. By this laser beam irradiation, the Ga compound in the buffer layer 13 is broken and a separation layer 19 formed of plural $N_2$ gas layers formed into a shape of islands and a Ga layer is formed at the boundary surface between the epitaxy substrate 11 and the buffer layer 13 (see FIG. 8). Although being formed over the whole surface of the buffer layer 13 in some cases, the $N_2$ gas layers tend to be formed over a wider range more evenly when the positions thereof are closer to the outer circumference of the buffer layer 13 as shown in FIG. 8.

The above-described separation layer forming step is carried out under the following laser processing conditions for example.

| | |
|---|---|
| Light source | YAG pulsed laser |
| Wavelength | 257 nm |
| Repetition frequency | 50 kHz |
| Average output power | 0.12 W |
| Pulse width | 100 ps |
| Peak power | 5 μJ to 3 μJ |
| Spot diameter | 70 μm |
| Movement speed of laser irradiating unit | 50 mm/second to 100 mm/second |

Figure 6:
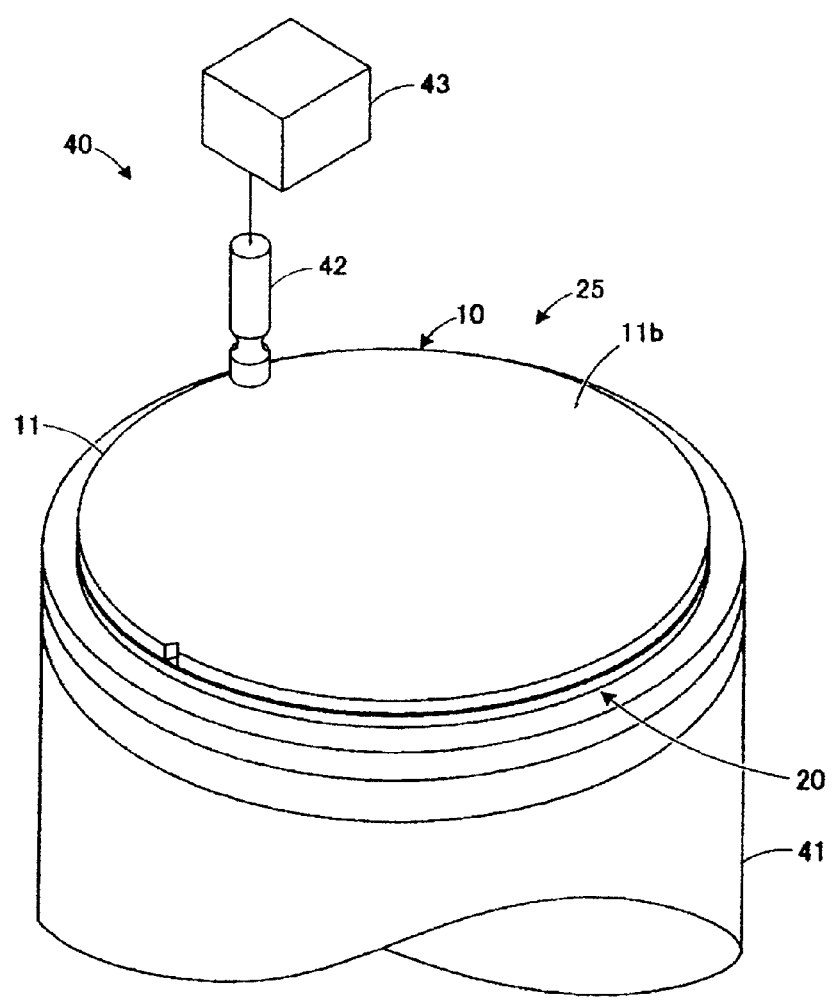
FIG. 6 is a schematic perspective view showing an optical device layer transfer step.
Figure 7:
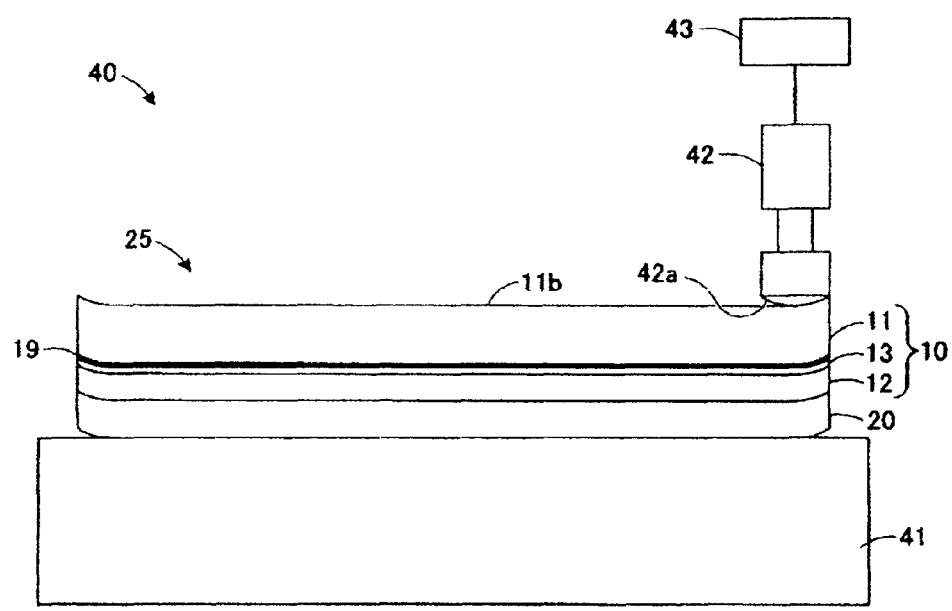
FIG. 7 is a schematic diagram for explaining the optical device layer transfer step.
Figure 8:
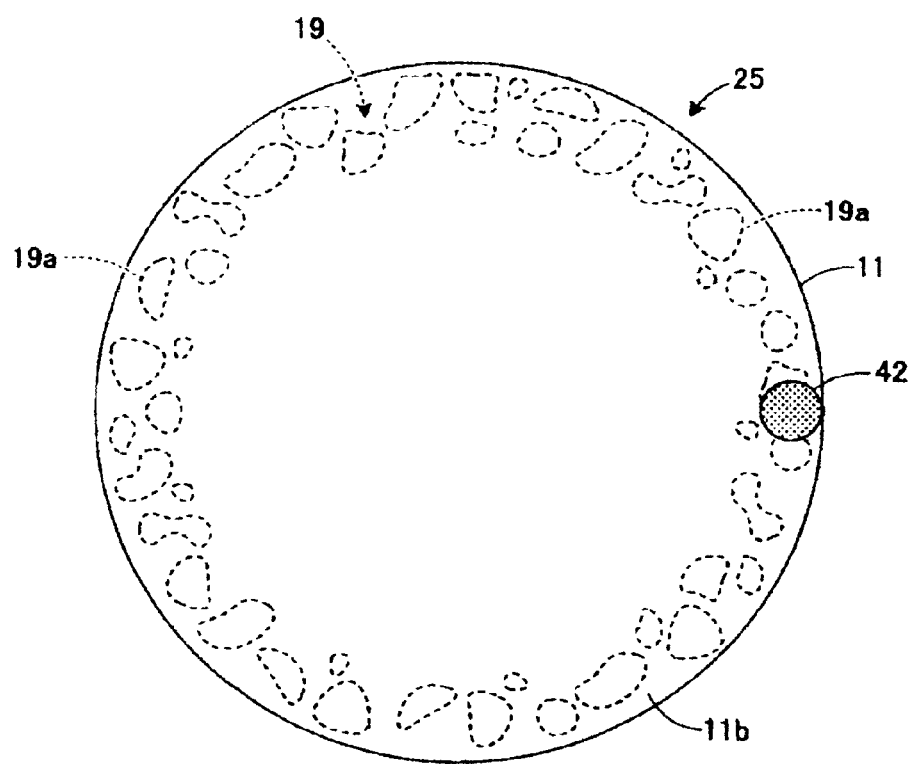
FIG. 8 is a plan view showing the position of the contact of an ultrasonic horn with an epitaxy substrate in the optical device layer transfer step.
Figure 9:
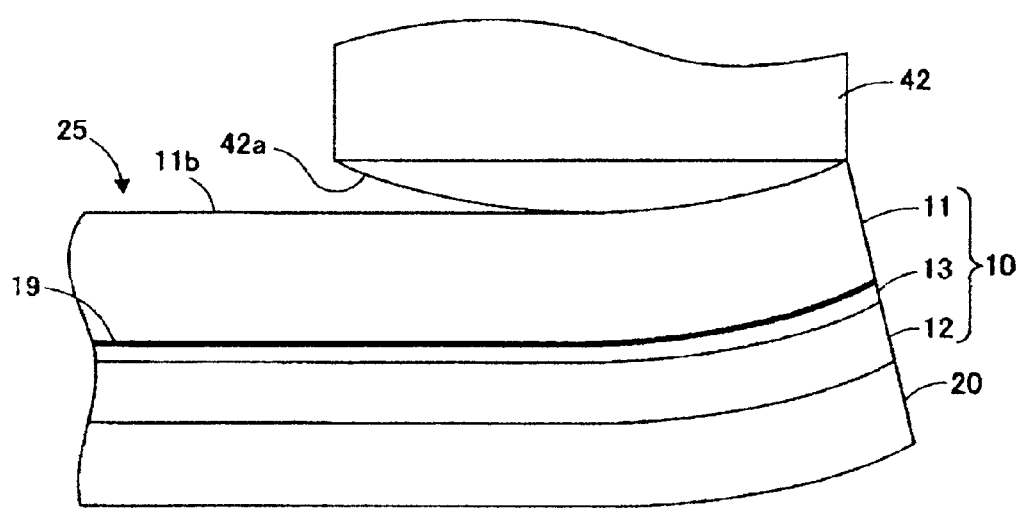
FIG. 9 is an explanatory diagram made by enlarging part of FIG. 7.
Figure 10A:
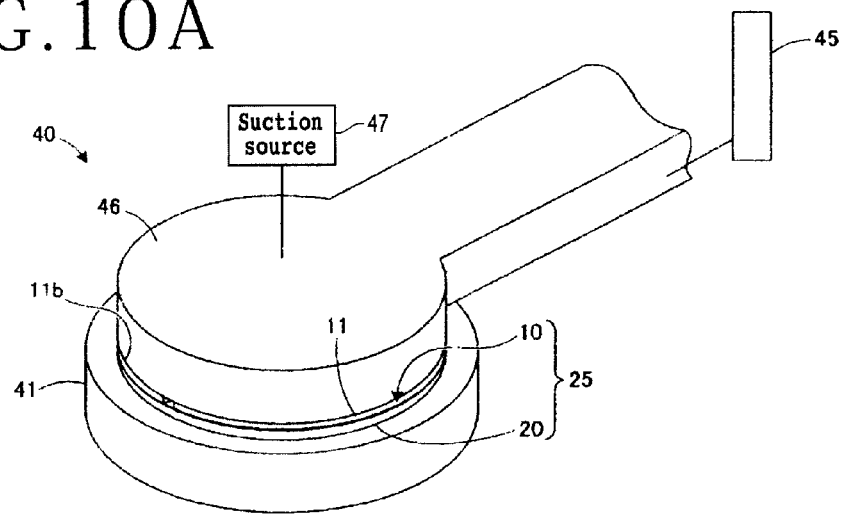
FIGS. 10A and 10B are schematic perspective views showing the optical device layer transfer step.
Figure 10B:
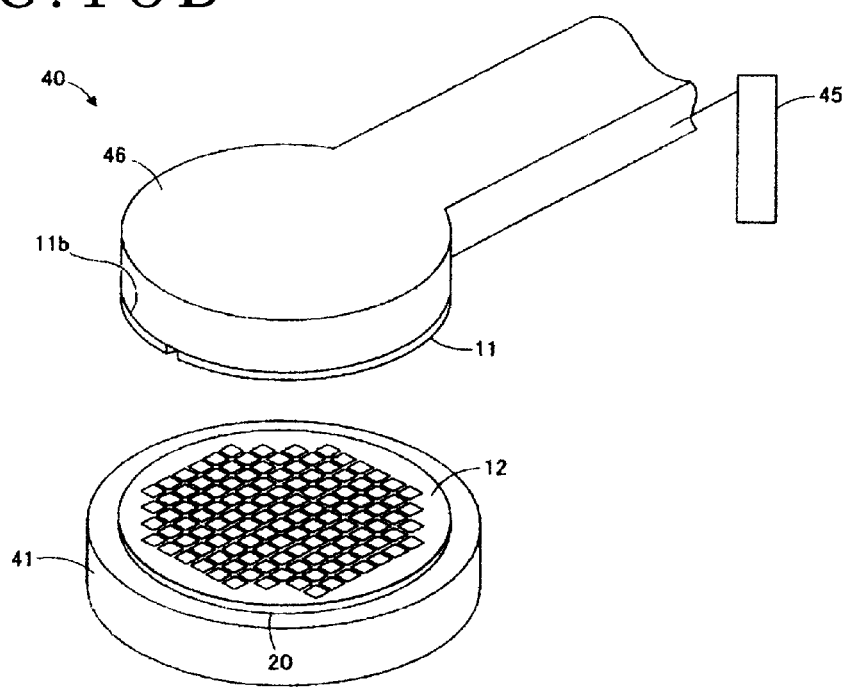

After the separation layer forming step is carried out, as shown in FIGS. 6 to 10B, an optical device layer transfer step of separating the epitaxy substrate 11 from the transfer substrate 20 to transfer the optical device layer 12 to the transfer substrate 20 is carried out. FIG. 6 is a schematic perspective view for explaining the optical device layer transfer step. FIG. 7 is a schematic diagram for explaining the optical device layer transfer step. FIG. 8 is an explanatory plan view showing the position of the contact of an ultrasonic horn with the epitaxy substrate in the optical device layer transfer step. FIG. 9 is an explanatory diagram made by enlarging part of FIG. 7. FIG. 10A is a schematic perspective view for explaining a state immediately before transfer of the optical device layer. FIG. 10B is a schematic perspective view for explaining a state in which the optical device layer is transferred.

In the optical device layer transfer step, the side of the transfer substrate 20 of the composite substrate 25 is placed on the top surface (holding surface) of a holding table 41 in transfer apparatus 40. Then, on the holding table 41, the composite substrate 25 is held by suction by a suction unit (not shown), with the back surface 11b of the epitaxy substrate 11 oriented upward. Subsequently, a vibration giving unit 43 connected to an ultrasonic horn 42 is actuated to give ultrasonic vibration from the vibration giving unit 43 to the ultrasonic horn 42. By this vibration giving, the ultrasonic horn 42 having a circular cylindrical shape becomes a state to oscillate ultrasonic vibration. Then, as shown in FIG. 7, a tip surface 42a of the ultrasonic horn 42 in this state is brought into contact with one arbitrary position at the outer circumferential part of the epitaxy substrate 11. Along with this, the ultrasonic vibration of the ultrasonic horn 42 is propagated to the epitaxy substrate 11 and the epitaxy substrate 11 vibrates. The contact position of the ultrasonic horn 42 may be set to an arbitrary position on the back surface 11b of the epitaxy substrate 11. However, it is preferable to set the position at the outer circumferential part of the epitaxy substrate 11 and it is more preferable to bring the outermost circumference of the epitaxy substrate 11 and the outermost circumference of the ultrasonic horn 42 as close to each other as possible. Further preferably, these outermost circumferences accord with each other.

As shown in the enlarged view of FIG. 9, warpage is caused on the outer circumferential side in the composite substrate 25. Specifically, when the composite substrate 25 is so placed that the back surface 11b of the epitaxy substrate 11 is oriented upward, warpage is so caused that the outer circumference of the composite substrate 25 curves upward. The reason for this will be the difference in the thermal expansion coefficient between the transfer substrate 20 and the optical device wafer 10 joined to each other, and so forth. Meanwhile, in the ultrasonic horn 42, the tip surface (contact surface) 42a brought into contact with the back surface 11b of the epitaxy substrate 11 is formed of a slightly-curved surface. Therefore, the tip surface 42a of the ultrasonic horn 42 gets line contact or surface contact along the back surface 11b of the epitaxy substrate 11 in which the warpage is caused, which can achieve increase in the contact area between them. Because of this, the ultrasonic vibration can be efficiently propagated by setting the contact position of the tip surface 42a of the ultrasonic horn 42 at the outer circumferential part of the epitaxy substrate 11. The curved surface forming the tip surface 42a is formed similarly to the lowermost part of a spherical surface set to a predetermined diameter size for example so as to be obtained as a downward-convex curved surface.

The ultrasonic vibration is guessed to be propagated from the epitaxy substrate 11 via the $N_2$ gas layers 19a of the separation layer 19 as shown in FIG. 8. At the outer circumferential part of the epitaxy substrate 11, with which the ultrasonic horn 42 gets contact, the $N_2$ gas layers 19a are formed in the separation layer 19 over a wide range and thus vibration can be oscillated from a position extremely close to the $N_2$ gas layer 19a, such as a position just above the $N_2$ gas layer 19a. This also can further enhance the efficiency of the vibration propagation.

Furthermore, employing a curved surface as the tip surface 42a of the ultrasonic horn 42 makes it possible to radially propagate the ultrasonic vibration from the tip surface 42a. In contrast, in a configuration in which the tip surface of the ultrasonic horn 42 is a flat surface, the vibration is propagated only in the direction orthogonal to this flat surface. Therefore, when a curved surface is employed as the tip surface 42a, the ultrasonic vibration can be diffusely propagated and the efficiency of the vibration propagation can be further enhanced.

The optical device layer transfer step is carried out by setting the conditions of the ultrasonic horn 42 having a circular cylindrical shape and the vibration giving unit 43 as follows for example.

| Diameter of circular cylinder | 15 mm |
|---|---|
| Radius of curvature of tip surface 42a | 300 mm |
| Ultrasonic frequency | 20 kHz |
| Ultrasonic amplitude | 20 μm |

The above respective conditions of the tip surface 42a have no connection with the diameter size of the optical device wafer 10 and the shape of the ultrasonic horn 42 does not need to be changed even when the diameter size of the optical device wafer 10 changes. For example, it is possible to respond to change in the diameter size of the optical device wafer 10 by changing the ultrasonic amplitude to larger amplitude when the diameter size of the optical device wafer 10 becomes larger.

After the giving of the ultrasonic vibration by the ultrasonic horn 42, as shown in FIG. 10A, a moving unit 45 is actuated to lower down a suction pad 46 and a suction surface (lower surface) of the suction pad 46 is placed on the back surface 11b of the epitaxy substrate 11 in the composite substrate 25. Subsequently, the back surface 11b of the epitaxy substrate 11 is sucked to the suction surface of the suction pad 46 by actuating a suction source 47. Then, as shown in FIG. 10B, the moving unit 45 is actuated to raise the suction pad 46 in such a direction as to detach from the holding table 41. Thereby, the epitaxy substrate 11 is separated from the optical device layer 12, so that the transfer of the optical device layer 12 to the transfer substrate 20 is completed.

As above, in the lift-off method according to the present embodiment, ultrasonic vibration can be efficiently propagated as described above by bringing the ultrasonic horn 42 into contact with the outer circumferential part of the epitaxy substrate 11. This can sufficiently break the coupling state between the epitaxy substrate 11 and the optical device layer 12 by the buffer layer 13. As a result, damage to the optical device layer 12 due to separation of the epitaxy substrate 11 can be avoided and the epitaxy substrate 11 can be separated from the optical device layer 12 rapidly and smoothly. According to the method of the present embodiment, the epitaxy substrate 11 can be separated from the optical device layer 12 even in a patterned sapphire substrate (PSS) wafer, in which the separation is considered difficult, and in a 4-inch wafer.

The present invention is not limited to the above embodiment and can be carried out with various changes. In the above embodiment, the sizes, shapes, and so forth of the respective constituent elements are not limited to those represented in the accompanying drawings and can be changed as appropriate in a range in which effects of the present invention are exerted. Other factors can also be carried out with appropriate changes without departing from the scope of the object of the present invention. For example, in the above embodiment, the above respective steps may be carried out by different pieces of apparatus or may be carried out by the same apparatus.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A lift-off method for transferring, to a transfer substrate, an optical device layer of an optical device wafer in which the optical device layer is formed over a front surface of an epitaxy substrate with intermediary of a buffer layer composed of a Ga compound containing Ga, the lift-off method comprising:

a transfer substrate joining step of joining the transfer substrate to a surface of the optical device layer of the optical device wafer with intermediary of a joining metal layer;

a separation layer forming step of forming a separation layer at a boundary surface between the epitaxy substrate and the buffer layer by performing irradiation with a pulsed laser beam having such a wavelength as to be transmitted through the epitaxy substrate and be absorbed by the buffer layer from a back surface side of the epitaxy substrate of the optical device wafer to which the transfer substrate is joined; and an optical device layer transfer step of, after the separation layer forming step is carried out, bringing an ultrasonic horn that oscillates ultrasonic vibration into contact with the epitaxy substrate to vibrate the epitaxy substrate and separating the epitaxy substrate from the transfer substrate to transfer the optical device layer to the transfer substrate, wherein the ultrasonic horn is brought into contact with an outer circumferential part of the epitaxy substrate in the optical device layer transfer step, wherein the outer peripheral part of the epitaxy substrate includes an upwardly curved surface as a result of warpage, and wherein said ultrasonic horn includes a contact surface comprised of a downward-convex curved surface that is configured and arranged for making line contact or surface contact with the upwardly curved surface of the outer part of the epitaxy substrate.

2. The lift-off method according to claim 1, wherein the ultrasonic horn is brought into contact only with the outer circumferential part of the epitaxy substrate in the optical device layer transfer step.

* * * * *